(12) United States Patent
Gotou

(10) Patent No.: US 9,436,905 B2
(45) Date of Patent: Sep. 6, 2016

(54) METHOD FOR MANUFACTURING ANTENNA SHEET

(71) Applicant: TOPPAN PRINTING CO., LTD., Tokyo (JP)

(72) Inventor: Hiroyoshi Gotou, Kawagoe (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/753,843

(22) Filed: Jun. 29, 2015

(65) Prior Publication Data

US 2015/0302291 A1 Oct. 22, 2015

Related U.S. Application Data

(62) Division of application No. 13/138,918, filed as application No. PCT/JP2010/003060 on Apr. 28, 2010, now Pat. No. 9,183,488.

(30) Foreign Application Priority Data

Apr. 28, 2009 (JP) .................................. 2009-109859

(51) Int. Cl.
G06K 19/077 (2006.01)
H05K 3/40 (2006.01)

(52) U.S. Cl.
CPC ... G06K 19/07783 (2013.01); G06K 19/07754 (2013.01); H05K 3/4038 (2013.01); H05K 3/4084 (2013.01); H05K 2201/0129 (2013.01); H05K 2201/0355 (2013.01); H05K 2201/0379 (2013.01); H05K 2201/0382 (2013.01);

(Continued)

(58) Field of Classification Search
USPC .......................................................... 235/492
See application file for complete search history.

(56) References Cited

U.S. PATENT DOCUMENTS 4,627,565 A 12/1986 Lomerson
6,073,856 A 6/2000 Takahashi ..................... 235/492

(Continued)

FOREIGN PATENT DOCUMENTS

DE 19522338 1/1997
DE 19618100 A1 11/1997

(Continued)

OTHER PUBLICATIONS

Notice of Allowance mailed Jul. 7, 2015 in related U.S. Appl. No. 13/138,918.

(Continued)

*Primary Examiner* — Michael G Lee
*Assistant Examiner* — David Tardif

(57) ABSTRACT

A method for manufacturing an antenna sheet. The method is for connecting at least one of an antenna coil and a connection pattern, to a conductive member. The at least one of the antenna coil and the connection pattern is provided on one surface of a substrate and the conductive member is provided on the other surface of the substrate. The method includes a pressing process performed to form a first through hole to the substrate, wherein the first through hole passes through the substrate, and to bring the at least one of the antenna coil and the connection pattern, and the conductive member into contact with each other. The method also includes a melting process performed to melt the at least one of the antenna coil and the connection pattern, and the conductive member to each other.

14 Claims, 8 Drawing Sheets

(52) U.S. Cl.
CPC ............... *H05K2201/0394* (2013.01); *H05K 2201/10098* (2013.01); *H05K 2203/0195* (2013.01); *H05K 2203/107* (2013.01); *Y10T 29/49016* (2015.01); *Y10T 29/49018* (2015.01)

(56) References Cited

U.S. PATENT DOCUMENTS

| | | | | |
|---|---|---|---|---|
| 2005/0110129 | A1* | 5/2005 | Akita | G06K 19/07752 257/696 |
| 2007/0111391 | A1* | 5/2007 | Aoki | H01Q 1/38 438/118 |
| 2010/0277382 | A1* | 11/2010 | Tanaka | G06K 19/07749 343/741 |

FOREIGN PATENT DOCUMENTS

| | | |
|---|---|---|
| EP | 2192530 | 6/2010 |
| JP | 2002-368523 | 12/2002 |
| JP | 2003-44810 | 2/2003 |
| JP | 2003-69294 | 3/2003 |
| JP | 2007-323386 | 12/2007 |
| JP | 2008-15968 | 1/2008 |
| JP | 2008-269161 | 11/2008 |
| JP | 2008-311688 | 12/2008 |
| TW | 200503325 | 1/2005 |
| WO | WO 01/75789 A1 | 10/2001 |
| WO | 2007/099926 A1 | 9/2007 |
| WO | 2009/035094 | 3/2009 |
| WO | 2009/035094 A1 | 3/2009 |

OTHER PUBLICATIONS

International Search Report for PCT/JP2010/003060 mailed Jun. 15, 2010.
Extended European Search Report issued Nov. 7, 2012 in corresponding European Patent Application No. 10769518.1.
Taiwanese Office Action mailed Feb. 12, 2014 in corresponding Taiwanese Application No. 099113408.
Restriction Requirement mailed from the United Stated Patent and Trademark Office on Aug. 16, 2013 in the related U.S. Appl. No. 13/138,918.
Office Action mailed from the Unites Stated Patent and Trademark Office on Oct. 4, 2013 in the related U.S. Appl. No. 13/138,918.
Office Action mailed from the Unites Stated Patent and Trademark Office on Jun. 6, 2014 in the related U.S. Appl. No. 13/138,918.
Office Action mailed from the Unites Stated Patent and Trademark Office on Feb. 26, 2015 in the related U.S. Appl. No. 13/138,918.
Japanese Office Action mailed Mar. 24, 2015 in corresponding Japanese Patent Application No. 2014-174471.
U.S. Appl. No. 13/138,918, filed Oct. 24, 2011, Hiroyoshi Gotou, Toppan Printing Co., Ltd.

* cited by examiner

METHOD FOR MANUFACTURING ANTENNA SHEET

CROSS-REFERENCE TO RELATED APPLICATIONS

This application is a divisional of and claims priority benefit to U.S. patent application Ser. No. 13/138,918, filed Oct. 24, 2011, pending, the application Ser. No. 13/138,918 claiming the benefit under 35 U.S.C. Section 371, of PCT International Application No. PCT/JP2010/003060, filed Apr. 28, 2010, which claimed priority to Japanese Application No. 2009-109859, filed Apr. 28, 2009 in the Japanese Patent Office, the disclosures of all of which are hereby incorporated by reference.

BACKGROUND

1. Field

The present invention relates to an antenna sheet, a data carrier with a non-contact IC, and a method for manufacturing an antenna sheet.

2. Description of Related Art

Systems using non-contact IC cards and non-contact IC tags have come into increased use in recent years. For example, non-contact data media which are provided with an IC inlet capable of electronic data input or the like are used in booklets such as passports and bank passbooks. A non-contact data medium has an integrated circuit (IC chip) and an antenna that is connected to the integrated circuit, with a base material that is superior in tear strength to high-quality paper or coated paper and also has good flexibility attached to both sides of the antenna sheet.

In general, the antenna of an antenna sheet, in addition to functioning as an antenna for data communication, functions as a coil to generate electrical power by electromagnetic induction for driving the integrated circuit. For this reason, in an antenna sheet a band-shaped antenna is wound in a coil-like (helical) shape on the surface of the antenna sheet. Given this constitution, the ends of the antenna are disposed at the inside and outside of the coil.

In order to connect the two ends of the antenna to the integrated circuit, it is necessary at least at one location to have a bridge between the inside and the outside of the antenna. In the usual antenna sheet, a conductive member (bridge pattern) is provided on the side of the sheet base material opposite from the side on which the antenna is formed, the inside and outside of the antenna being bridged by making a connection between the bridge pattern and the antenna end part and/or connection pattern.

In this type of connection part between the bridge pattern and the antenna, after forming the bridge pattern and antenna on both sides of the sheet base material, electrical conductivity is established therebetween by crimping both to make a mechanical contact therebetween (for example, Patent Document 1). Another known method of achieving electrical conductivity is to provide a through hole in the sheet base material and then either plate the inside of the hole or fill it with a conductive member.

Patent Document 1: Japanese Patent No. 3634774

DISCLOSURE OF INVENTION

Problem to be Solved by the Invention

However, the following problems exist with the above-noted method. Specifically, with connection by crimping, because the connection is made by merely mechanical pressure, the bonding strength at the connection part is weak, and the reliability as an electrical connection is low. For this reason, when heat treating is done after the connection is made by crimping, he difference in the coefficient of thermal expansion between the sheet base material and the antenna results in warping, causing the opening of the electrical connection and preventing a sufficient electrical connection. Also, with connection by crimping, because there is only a physical contact at the connection part, it is not possible to maintain a stable contact resistance unless a certain pressure is applied. Also, with connection by crimping, there is the problem of oxidation or corrosion of the contact surfaces. Additionally, achieving conductivity via a through hole complicates the process and worsens manufacturing efficiency.

The present invention was made in consideration of the above-described situation, and has as an object to provide an antenna sheet that prevents open wires in the antenna to improve reliability, lowers the electrical resistance, and also enables an improvement in manufacturability. Another object is to provide a data carrier with a non-contact IC having such an antenna sheet. Yet another object is to provide a method for manufacturing an antenna sheet that prevents open wires to improve reliability, and also enables improvement in manufacturability.

Means for Solving the Problem (1) To solve the above-described problem, as a first aspect of the present invention, there is provided a method for manufacturing an antenna sheet, including: a pressing step in which an overlapped portion of an antenna coil and/or a connection pattern formed from a metal material and provided on one surface of a substrate formed from a thermoplastic resin, and a conductive member formed from a metal material and provided on the other surface of the substrate is pressed using a pressing unit at least from the surface of one side of the substrate; and a welding steps in which the overlapped portion of the antenna coil and/or the connection pattern and the conductive member is welded.

(2) In the first aspect of the present invention, in the pressing step, the overlapped portion of the antenna coil and/or the connection pattern and the conductive member may be pressed by a pressing unit that is heated to at least the softening temperature of the material that forms the substrate.

According to this method, in the pressing step the substrate that is sandwiched between the antenna coil and the conductive member is pressed by the pressing units while being heated to a temperature exceeding the softening temperature. For this reason, a melted substrate is pressed away.

(3) In the first aspect of the present invention, in the welding steps, a laser beam may strike a part pressed by the pressing unit to weld the antenna coil and/or the connection pattern to the conductive member.

According to this method, by performing the welding in the welding step by using laser beam, the antenna coil and/or the connection pattern and the conductive member are welded and securely connected. Because laser welding is a non-contact process, in contrast to a contact-type process in which soiling or wearing of a fixture influences the bonding quality, it is possible to achieve a bonding condition with stable quality. Also, because there is no fixture replacement required, it is possible to achieve a high production efficiency.

(4) In the first aspect of the present invention, in the welding step, a hole may be formed at the location that is struck by the laser beam.

According to this method, the strength of the bond between the antenna coil and/or the connection pattern and the conductive member made via the through hole is greatly strengthened after lamination. By detecting whether or not a through hole is formed at the location at which the laser beam strikes, it is possible to judge whether or not welding has been done between the antenna coil and/or connection pattern and the conductive member, thereby facilitating a check for a poor connection.

(5) In the first aspect of the present invention, the method for manufacturing an antenna sheet may further include a mounting step in which the antenna coil and an integrated circuit are connected.

By doing this, the antenna coil and the integrated circuit are connected, thereby enabling the manufacture of the IC inlet.

In general, integrated circuits such as IC chips are more expensive than other members. For this reason, by mounting the integrated circuit after connecting the antenna coil and/or connection pattern and the conductive member, it is possible to reduce the loss incurred by a failure occurring as a poor connection between the antenna coil and/or connection pattern and the conductive member.

In this context, the term "integrated circuit" encompasses not only an IC chip, but also a resin seal in which an IC chip is sealed, or a lead frame to which an IC chip is mounted, the combination of which with the IC chip is an IC module.

(6) In a second aspect of the present invention, there is provided an antenna sheet including: a substrate; a band-shaped antenna coil formed in the shape of a helix on one surface of the substrate; and a conductive member provided so as to extend on the other surface of the substrate in a direction that intersects with the antenna coil, and, when seen in plan view, to overlap with at least one end part of the two end parts of the antenna coil, wherein at least a part of a contacting part between the conductive member and one end of the antenna coil and/or connection pattern is welded.

According to this constitution, the antenna coil and/or connection pattern and the conductive member that are mounted on both sides of the substrate are securely connected physically, enabling an antenna sheet having a high, stable electrical reliability as well.

(7) In the second aspect of the present invention, the conductive member and the antenna coil and/or connection pattern may cover a through hole provided in the substrate and make mutual contact at the inner wall of the through hole.

According to this constitution, it is possible to provide an antenna sheet with high reliability.

(8) In the second aspect of the present invention, a hole may be formed at the welded portion of one end of the antenna coil and/or the connection pattern so as to pass mutually therethrough, and the conductive member and the antenna coil and/or connection pattern may be melted at the inner wall of the hole.

According to this constitution, because there is a strong connection between the antenna coil and/or connection pattern and the conductive member, it is possible to achieve electrical connection reliability.

(9) In the second aspect of the present invention, on the surface of the antenna sheet on which the antenna coil may be provided, an integrated circuit may be connected to the antenna coil and/or the connection pattern.

According to this constitution, the antenna coil and/or connection pattern and the integrated circuit are connected to manufacture an IC inlet. Also, by this constitution, it is possible to provide an IC inlet having a high-reliability antenna sheet.

(10) In the second aspect of the present invention, the antenna sheet may further include a protective member that covers the antenna coil and the integrated circuit.

According to this constitution, it is possible to provide a data recording medium having a high-reliability antenna sheet.

(11) In a third aspect of the present invention, there is provided a data carrier with a non-contact IC including; a substrate; a band-shaped antenna coil formed in the shape of a helix on one surface of the substrate; a conductive member provided so as to extend on the other surface of the substrate in a direction that intersects with the antenna coil, and, when seen in plan view, to overlap with at least one end part of the two end parts of the antenna coil; an integrated circuit that is connected to the antenna coil on the surface of the antenna sheet on which the antenna coil is provided; and a protective member that covers the antenna coil and the integrated circuit, wherein at least one part of the contacting part between the conductive member and one end of the antenna coil and/or connection pattern is welded.

According to this constitution, it is possible to provide a high-reliability data carrier.

Effect of the Invention

According to the present invention, it is possible to provide an antenna sheet that prevents open wires, improves reliability, and lowers the electrical resistance, and also improves manufacturability. It is additionally possible to provide, by providing this data sheet, a data carrier with a non-contact IC that prevents open wires, improves reliability, and also improves manufacturability, and a method for manufacturing the antenna sheet.

DESCRIPTION OF EMBODIMENTS

Best Mode for Carrying Out the Invention

An antenna sheet and IC inlet according to an embodiment of the present invention are described below, with references made to FIG. 1A to FIG. 4B. In all of the drawings referenced below, the ratios of thicknesses and the like of various constituent elements have been altered to make the drawings easy to understand.

(Antenna Sheet, IC Inlet)

Figure 1A:
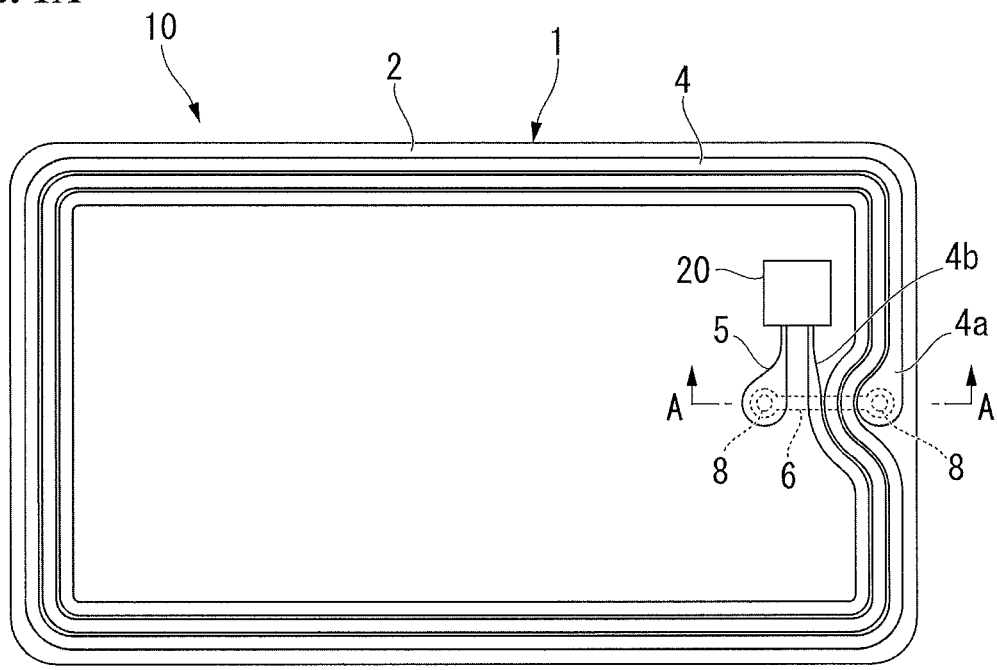
FIG. 1A is a plan view of the surface of one side of an antenna sheet and an IC inlet according to an embodiment of the present invention.
Figure 1B:
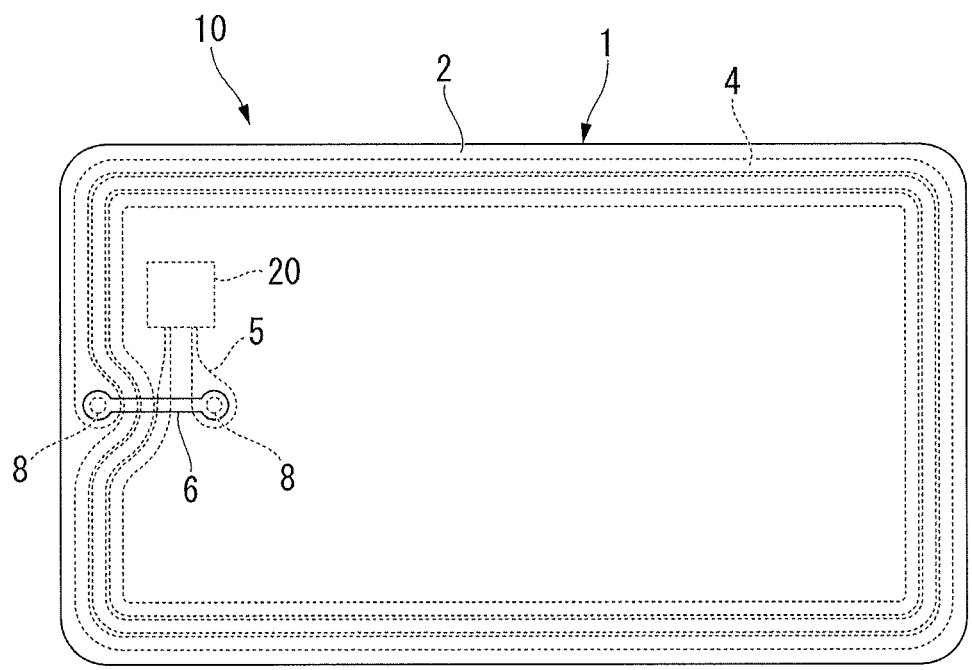
FIG. 1B is a plan view of the surface of the other side of an antenna sheet and an IC inlet according to the embodiment of the present invention.

FIG. 1A and FIG. 1B are plan views showing an antenna sheet 1 and an IC inlet 10 of the present embodiment. FIG. 1A is a plan view showing the surface on one side of the antenna sheet 1 and the IC inlet 10, and FIG. 1B is a plan view showing the surface on the other side of the antenna sheet 1 and the IC inlet 10. The IC inlet 10 of the present embodiment has an antenna sheet 1 and an integrated circuit (IC chip) 20. The integrated circuit 20 is mounted to the antenna sheet 1.

In the description below, the surface of the antenna sheet 1 to which the integrated circuit 20 is mounted is referred to as the main surface, and the surface opposite from the surface to which the integrated circuit 20 is mounted is referred to as the rear surface.

The antenna sheet 1 has a substrate 2, an antenna coil 4, a connection terminal 5, and a bridge pattern 6.

The substrate 2 is substantially rectangular when seen in plan view.

The antenna coil 4 is provided on the surface of one side of the substrate 2, and is band-shaped.

The connection terminal 5 is provided on the inside of the antenna coil 4, and is electrically conductive with an end part on the outside of the antenna coil 4.

The bridge pattern 6 connects the antenna coil 4 and the connection terminal 5 on the surface of the other side of the substrate 2, via a through hole 8 provided on the substrate 2.

In the substrate 2, the surface on which the antenna coil 4 is provided is the main surface of the substrate 2, and the main surface of the antenna sheet 1.

The material forming the substrate 2 is thermoplastic resin with insulating properties. As long as the material has insulating properties and is thermoplastic, it is possible to use a transparent resin or an opaque resin as the material forming the substrate 2. For example, materials that can be used to form the substrate 2 include polyester resins such as PEN (polyethylene naphthalate) or PET (polyethylene terephthalate), polycarbonate, polyethylene, polypropylene, and polystyrene. A compound material such as a laminate or mixture of the above-noted materials can also be used as the material for forming the substrate 2. Taking into consideration ease-of-processing and adhesion when an adhesive is used to adhere to other members, the IC inlet 10 of the present embodiment is formed using PET. The thickness of the substrate 2 is 38 μm.

Of thermoplastic resins, the substrate 2 is preferably a PET resin film, and an excessive thickness is not suitable for the substrate 2. The thickness of the substrate 2 is desirably in the range from 0.01 to 0.5 mm.

The shape of the antenna coil 4 is formed by patterning a metal thin film provided on the main surface of the substrate 2 by etching, and formed in the shape of a substantially rectangular helix along the peripheral part of the substrate 2 when seen in plan view. The antenna coil 4 is formed from a metal material having good electrical conductivity, such as aluminum or copper. The antenna coil 4 of the present embodiment is formed from aluminum, the thickness of which is 30 μm.

The connection terminal 5 is formed from the same material as the antenna coil 4 and, when seen in plan view, is provided in a region that is inside the antenna coil 4, this being a region that is surrounded by the antenna coil 4. The thickness of the connection terminal 5 in the present embodiment is 30 μm, which is the same as the antenna coil 4.

The bridge pattern 6 is formed from the same material as the antenna coil 4, and is provided on the rear surface of the substrate 2. The two ends of the bridge pattern 6 are electrically connected to the one outside terminal 3a of the antenna coil 4 and to the connection terminal 5, via through holes 8 provided in the substrate 2. By connecting the one end 3a of the antenna coil 4 and the connection terminal 5 via the bridge pattern 6, it is possible to bridge from the inside to the outside of the antenna coil 4 without interfering with the antenna 4. The thickness of the bridge pattern 6 in the present embodiment is made 20 μm.

The antenna coil 4 and the bridge pattern 6 are formed by attaching aluminum foil or copper foil of the same type of metal foil to the front and rear of the substrate 2 using adhesive, and then etching to form a pattern. Although it is possible to make the metal foils on the front and rear of the substrate 2 of different metals, it is desirable that they be made of this same metal. By making the metal foils on the front and rear of the substrate 2 the same type of metal, it is possible to etch both the front and the rear of the substrate 2 simultaneously, using the same conditions. Also, when differing types of metals are welded, the differing types of metals that can be welded are limited, and even if welding is possible, there is the possibility of causing galvanic corrosion, making it desirable that the front and rear metal foils on the substrate 2 be the same metal.

It is desirable that the thickness of the antenna coil 4 and the bridge pattern 6 be in the range from 0.01 to 0.05 mm.

The bridge pattern 6 may be formed by cutting out the required size from a metal foil and then positioning it on and welding it to the substrate 2. That is, the antenna sheet 1 can be manufactured by not forming the bridge pattern 6 by etching, but by forming only the antenna coil 4 by etching.

The integrated circuit 20 is disposed in a region within the antenna coil 4. One end 4b of the antenna coil 4 and the connection terminal 5 are connected to the integrated circuit 20. The one end 4b of the antenna coil is connected to the connection terminal 5 via the other end 4a of the antenna coil, and the bridge pattern 6.

Figure 2:
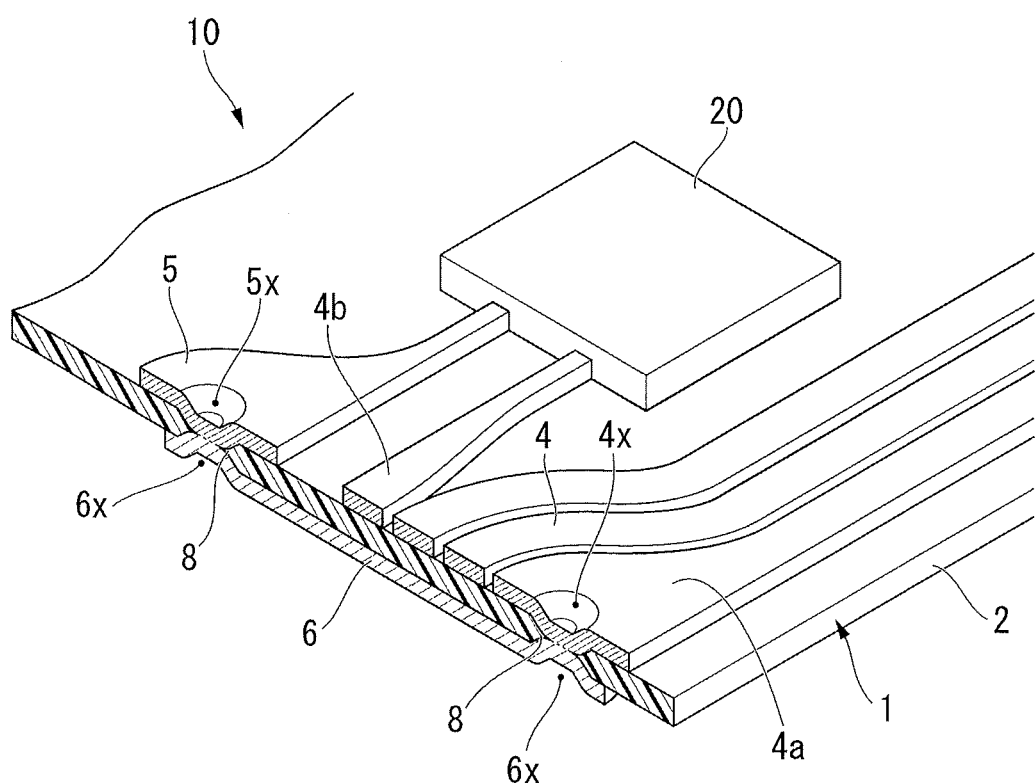
FIG. 2 is an oblique cross-sectional view of an antenna sheet and an IC inlet according to the embodiment of the present invention.

FIG. 2 is an oblique cross-sectional view of the antenna sheet 1 and the IC inlet 10, this including a cut-away view along the line A-A in FIG. 1A.

As shown in FIG. 2, at the one end 4a of the antenna coil 4, the connection terminal 5, and the bridge pattern 6 that overlap with the through hole 8 in plan view, there are depressions 4x, 5x, and 6x, respectively, which are depressed toward the substrate 2. As shown in FIG. 2, the connection terminal 5 (connection pattern) and the one end 4b of the antenna coil 4 are electrically connected to the integrated circuit 20. The connection terminal 5 is electrically connected to the bridge pattern 6 formed on the opposite side, with the substrate 2 therebetween. The depressions of the antenna coil 4 and bridge pattern 6, and the connection terminal 5 and bridge pattern 6 are in mutual contact at the inner wall of the through holes 8 and are mutually bonded by welding.

The antenna sheet 1 and the IC inlet 10 of the present embodiment are constituted as described above.

Next, a method of manufacturing the above-described antenna sheet 1 will be described. FIG. 3A and FIG. 3B, and FIG. 4A and FIG. 4B are process drawings that shows the method of manufacturing an antenna sheet 1A that is one form of the antenna sheet 1.

A feature of the method of manufacturing according to the present invention is a step of mutually connecting the antenna coil 4, the connection terminal 5 and the bridge pattern 6, which are provided on both sides of the substrate 2, with conventionally known manufacturing methods being usable for the other manufacturing steps. For this reason, in the description below, the step of connecting the antenna coil 4 and the bridge pattern 6 will be taken as an example, and will be mainly described as the step of connecting the antenna coil 4 and the bridge pattern 6. It should go without saying that the step of connecting the connection terminal 5 to the bridge pattern 6 can be performed in the same manner.

Figure 3A:
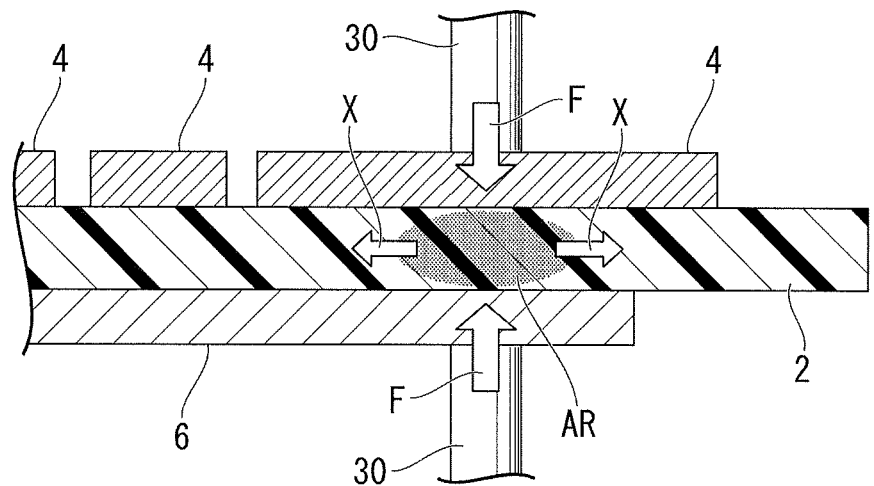
FIG. 3A is a cross-sectional view showing a manufacturing process for an antenna sheet according to the embodiment of the present invention.

First, as shown in FIG. 3A, the antenna coil 4 is formed on one surface of the substrate 2, and the bridge pattern 6 is formed on the other surface of the substrate 2. The antenna coil 4 and the bridge pattern 6 are formed, for example, by attaching an aluminum thin film to the substrate 2 using an adhesive, and using etching to remove the aluminum other than the desired pattern. The aluminum thin film may alternatively be formed over the substrate 2 by vapor deposition or sputtering or the like. Of course, as long as it is possible to form the antenna coil 4, the connection terminal, and the bridge pattern 6 having the desired patterns, the method is not restricted to the above.

Then, heated heat press heads 30 are brought up against the part of connection between the antenna coil 4 and the bridge pattern 6 from both sides of the substrate 2, and pressing is done from both sides.

A pulse heat type of heat press head 30 is preferably used. If a pulse heat type is used, it is possible to maintain the temperature after instantaneously raising the temperature of the head. The heat press heads 30 are provided with unit which cools by either air or water, enabling the head temperature to be lowered in a short period of time. Pressing is done, for example, with conditions of a head temperature of 300° C. to 600° C., a pressing time of 0.5 s to 2 s and a pressing force of 10 N to 60 N.

By pressing under the above-noted conditions, the substrate 2, which is formed by a thermoplastic resin, is melted in the region of overlapping with the heat press heads in plan view, as indicated by the symbol AR in FIG. 3A. The heat press heads 30 apply a force F with respect to the substrate 2. For this reason, the material that forms the substrate 2 that is melted flows so as to be pressed away in the direction of the symbols X.

Figure 3B:
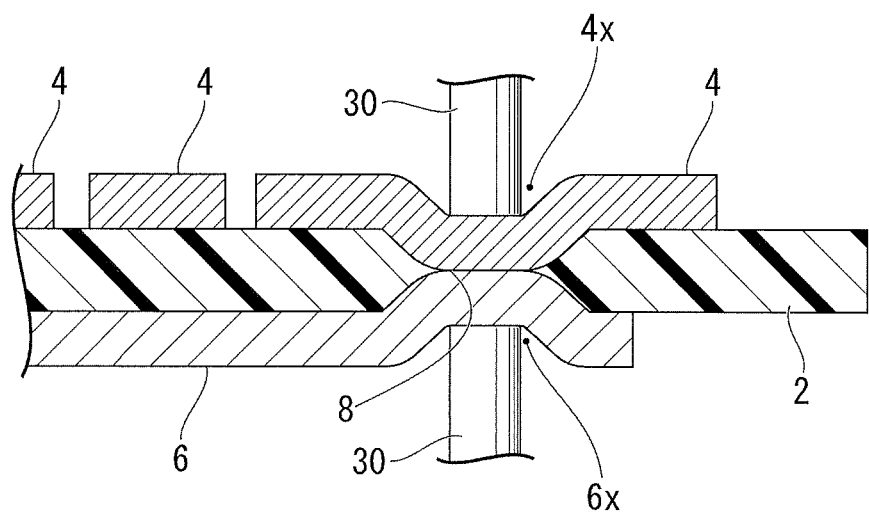
FIG. 3B is a cross-sectional view showing the manufacturing process for an antenna sheet according to the embodiment of the present invention, illustrating the condition after the process of FIG. 3A.

In the present embodiment, as shown in FIG. 3A and 3B, the heat press heads 30 are used as units to press the substrate 2 outward in the directions marked by the symbols X, although this is not a restriction. For example, an apparatus that uses ultrasonic waves as the pressing units to press the substrate away in the directions of the symbols X may be used.

As shown in FIG. 3A and FIG. 3B, the substrate 2 can be processed in a short period of time by bringing the heat press heads 30 up against the substrate 2 from both sides. Compared with the case of processing the substrate 2 by bringing a heat press head 30 up against the substrate 2 from only one side, it is possible to prevent non-uniform deformation of the substrate 2.

The antenna coil 4 and the bridge pattern 6, which are formed from a metal material, are not melted under the above pressing conditions, and are only deformed by the pressing force.

Then, as shown in FIG. 3B, the depressions 4x and 6x are formed in the antenna coil 4 and the bridge pattern 6 by the pressing with the heat press heads 30, and through holes 8 are formed in the substrate 2 by the melted flow of the substrate 2. The antenna coil 4 and the bridge pattern 6 make contact at the inner walls of the through holes 8. The antenna coil 4 and the bridge pattern 6 are in intimate contact with the substrate 2 at the inner walls of the through holes 8.

In this condition, after cooling down to 70° C., which is the softening temperature of the PET material that forms the substrate 2, the applied pressure is released. By doing this, because the pushed away material that forms the substrate 2 does not move, it becomes easy to maintain the contact condition between the antenna coil 4 and the bridge pattern 6. Also, if the heat press heads 30 making contact with the substrate 2 move and remove pressure while the substrate 2 is melted, the antenna coil 4 and the bridge pattern 6 will move to track the movement of the heat press heads 30, leading to the risk of damage to the substrate 2. In the present embodiment, however, because the pressure is released after air cooling, it is possible to prevent damage during such a process.

In FIG. 3A and FIG. 3B, circular column-shaped heat press heads 30 are used. The shape of the heat press heads for pressing the substrate 2 away in the directions marked by the symbols X (FIG. 3A) can be flat at the end and shaped with a taper on the side surface.

If the end of the heat press heads 30 are spherical, the region of the substrate 2 that is pressed out (the part of contact between the heat press head 30 and the substrate 2) becomes a point, and the substrate 2 remains thick in the location to be welded by the laser beam L, so that there is a possibility that a stable bonding of the antenna coil 4 and the bridge pattern 6 will not be made.

By using heat press heads 30 having a taper formed on its side surface, it is easy to press the substrate 2 outward in the directions marked by the symbols X (FIG. 3A). Also, when the heat press heads 30 are pulled away from the substrate 2, this enables a reduction of the force that is generated and applied the antenna coil 4 and the bridge pattern 6 in pulling away direction. For this reason, the intimacy of contact by laser welding between the antenna coil 4 and the bridge pattern 6 can be improved.

The head diameter of the heat press heads 30 can be at least 1.0 times the diameter of the laser beam L. More preferably, the head diameter of the heat press heads 30 is 1.0 to 10 times the diameter of the laser beam L, and yet more preferably, the head diameter of the heat press heads 30 is 5 to 7 times the diameter of the laser beam L.

In the present embodiment, the diameter of the laser beam L is made 0.3 mm, and the head diameter of the heat press heads 30 is made 2.0 mm. By making the head diameter of the heat press heads 30 and the diameter of the laser beam L close to one another, it is possible to increase the physical strength.

When heat pressing with the heat press heads 30, air may be blown onto the area surrounding the location of the substrate 2 being processed, to facilitate cooling in the vicinity of the location of processing, and prevent excessive melting of the surrounding substrate 2. By doing this, it is possible to prevent the contacting of the antenna coil 4 and the bridge pattern 6 at a location other than the connection location on the front and rear of the substrate 2, which changes the electrical characteristics of the antenna, if there is excessive melting of the substrate 2. Also, because the substrate 2 does not exist in the area surrounding the welding location that connects the front and rear of the substrate 2, it is possible to prevent a decrease in the physical strength of the antenna sheet 1. Thus, the blowing of air or the like can be used to cool the area surrounding the processed location, so that the substrate 2 can be melted in only the location at which the heat press heads 30 makes contact.

Figure 4A:
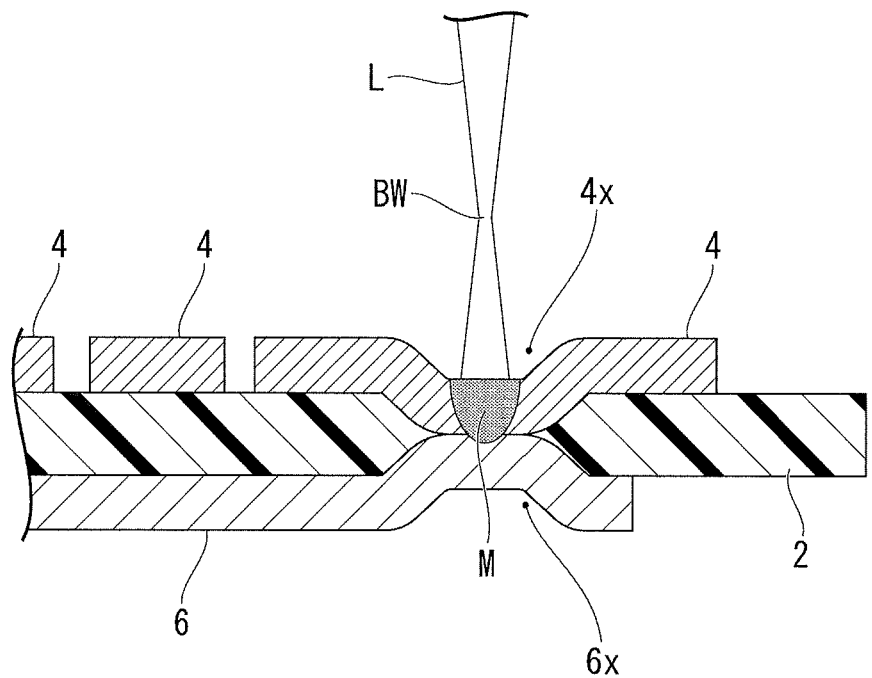
FIG. 4A is a cross-sectional view showing a manufacturing process for an antenna sheet according to the embodiment of the present invention, illustrating the condition after the process of FIG. 3B.

Next, as shown in FIG. 4A, laser beam L is made to strike the locations at which the depressions 4x and 6x are provided, so as to weld the antenna coil 4 and the bridge pattern 6. Although the laser beam L is shown as striking from the antenna coil 4 side in FIG. 4A, it can of course strike from the bridge pattern 6 side.

In the case in which the forming material of a member to be welding is aluminum, it is preferable that a YAG (yttrium aluminum garnet) laser having an oscillation wavelength of 1064 nm be used, and the in case of copper being the forming material, it is preferable that a YAG laser having an oscillation wavelength of 532 nm be used. The range of laser beam L energy is preferably from 1 J to 10 J.

Using this type of laser beam L, for example, by distancing the focal point BW from the surface of the antenna coil 4, the melted condition of the metal material is suppressed, and the antenna coil 4 and the bridge pattern 6 are welded. The laser conditions when this is done are such that the laser beam L is at a position that is 5 mm removed from the focal point BW as it strikes the surface of the antenna coil 4, with an energy of 2.2 J.

Figure 4B:
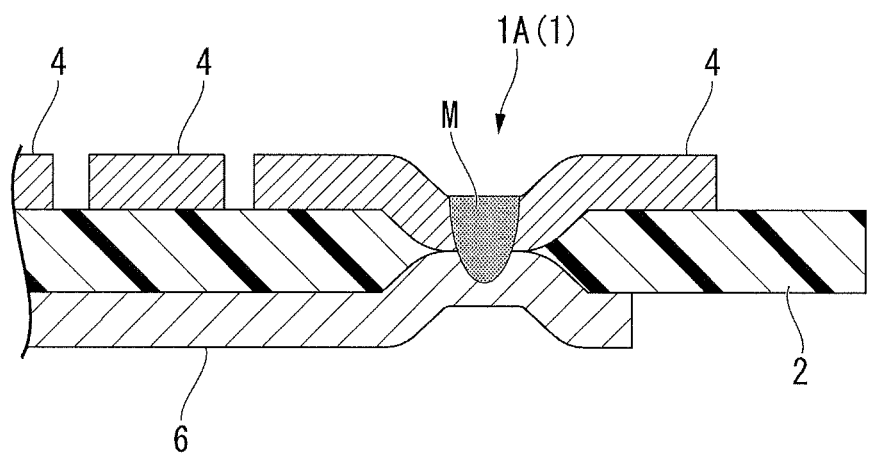
FIG. 4B is a cross-sectional view showing a manufacturing process for an antenna sheet according to the embodiment of the present invention, illustrating the condition after the process of FIG. 4A.

By doing this, as shown in FIG. 4B the antenna coil 4 and the bridge pattern 6 can be welded via the melted part M, without passing completely through the antenna coil 4 and the bridge pattern 6.

The foregoing manufactures the antenna sheet 1A of the present embodiment.

According to the antenna sheet 1A constituted as described above, the antenna coil 4 and the bridge pattern 6, which are disposed on both sides of the substrate 2, are bonded together by melting. For this reason, the antenna coil 4 and the bridge pattern 6 are physically strongly connected, and it is possible to use this as an antenna sheet with lowered electrical resistance and high stable electrical reliability.

The object of lowering the resistance value between the antenna coil 4 and the bridge pattern 6 is to eliminate the resistance value component at the contact part between the antenna coil 4 and the bridge pattern 6, so that there is only the conductor resistance of the metal that includes the welded part as well. By doing this, it is possible to reduce the instability element of an electrical connection made by only contacting between the antenna coil 4 and the bridge pattern 6, thereby achieving reliability.

If an electrical connection is made by only the contacting between the antenna coil 4 and the bridge pattern 6, it is not possible to maintain the contact resistance unless a certain pressure is applied, and there is the possibility of oxidation or corrosion of the contact surfaces.

According to the method of manufacturing the antenna sheet 1A constituted as noted above, it is possible to bond the antenna coil 4 and the bridge pattern 6 by non-contact laser welding. For this reason, it is possible to achieve a bonding condition with stable quality, in contrast to the case of a contact-type process, in which soiling or wearing of a fixture influencing the bonding quality. Also, because there is no fixture replacement required, it is possible to achieve high production efficiency.

Because, by using laser welding, the resistance value component of the connection part is eliminated, and there is the conductor resistance of the metal that includes the welded part as well, it is possible to reduce the instability element of connection, thereby achieving reliability.

Figure 5A:
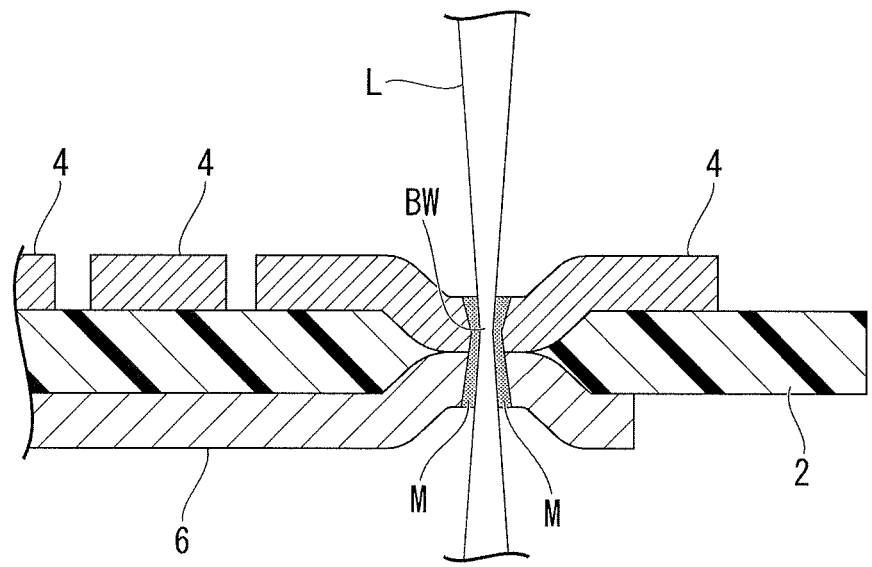
FIG. 5A is a cross-sectional view showing a manufacturing process for an antenna sheet according to a different embodiment of the present invention.
Figure 5B:
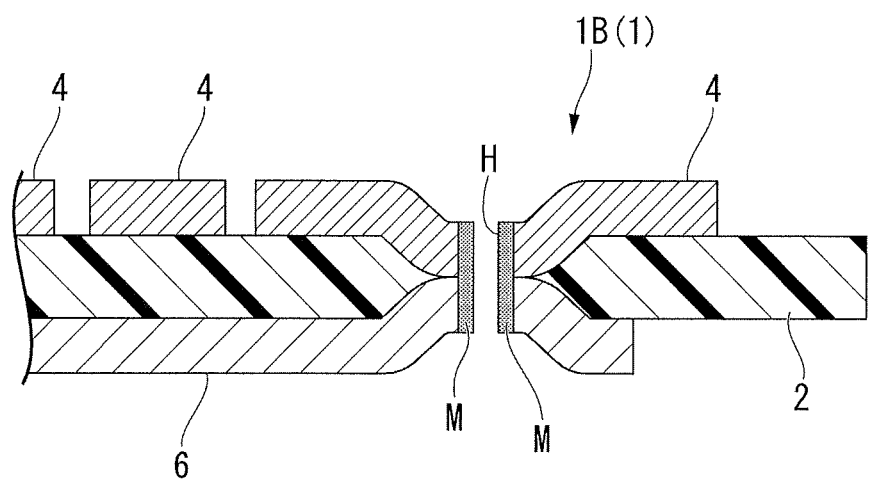
FIG. 5B is a cross-sectional view showing the manufacturing process for an antenna sheet according to the different embodiment of the present invention, illustrating the condition after the process of FIG. 5A.

Although in the above-described manufacturing process, the description was for the case in which the antenna coil 4 and the bridge pattern 6 in the antenna sheet 1A are welded without passing through these two elements, the same type of process can be used to manufacture the antenna sheet 1 of a different embodiment. FIG. 5A and FIG. 5B are process drawings for the method of manufacturing an antenna sheet 1B according to another embodiment of the present invention, these corresponding to FIG. 4A and FIG. 4B.

As shown in FIG. 5A, the focal point BW of the laser beam L is caused, for example, to strike a position in the vicinity of the contact the surface of the antenna coil 4 or the part of contact between the antenna coil 4 and the bridge pattern 6. By doing this, the laser beam L passes through the antenna coil 4 and the bridge pattern 6.

For this reason, as shown in FIG. 5B, the periphery of the hole H that passes through the antenna coil 4 and the bridge pattern 6 becomes the melted part M and is welded, so as to obtain the antenna sheet 1B, in which the antenna coil 4 and the bridge pattern 6 are welded. The diameter of the hole H is approximately 0.2 mm to 2 mm.

In the antenna sheet 1B obtained in this manner, the material forming the antenna coil 4 and the bridge pattern 6 are melted at the inner wall of the hole H. By doing this, the antenna coil 4 and the bridge pattern 6 are held together strongly, enabling the achievement of a highly reliable electrical connection.

Also, when the antenna coil 4 and the bridge pattern 6 are welded by passing the laser beam L therethrough, because it is possible to check from the outer appearance whether or not the antenna coil 4 and the bridge pattern 6 are welded, it is possible to check for a poor connection.

The IC inlet 10 according to the embodiment of the present invention is preferably made by mounting the integrated circuit 20 as shown in FIG. 1A and FIG. 1B after making an electrical connection between the antenna coil 4, the connection terminal 5, and the bridge pattern 6, using the above-described method. In general, the integrated circuit 20 is more expensive than other members. For this reason, if the antenna coil 4 and the bridge pattern 6 are connected after the integrated circuit 20 is mounted, the loss incurred by a failure occurring as a poor connection increases.

(Data Recording Medium)

Figure 6A:
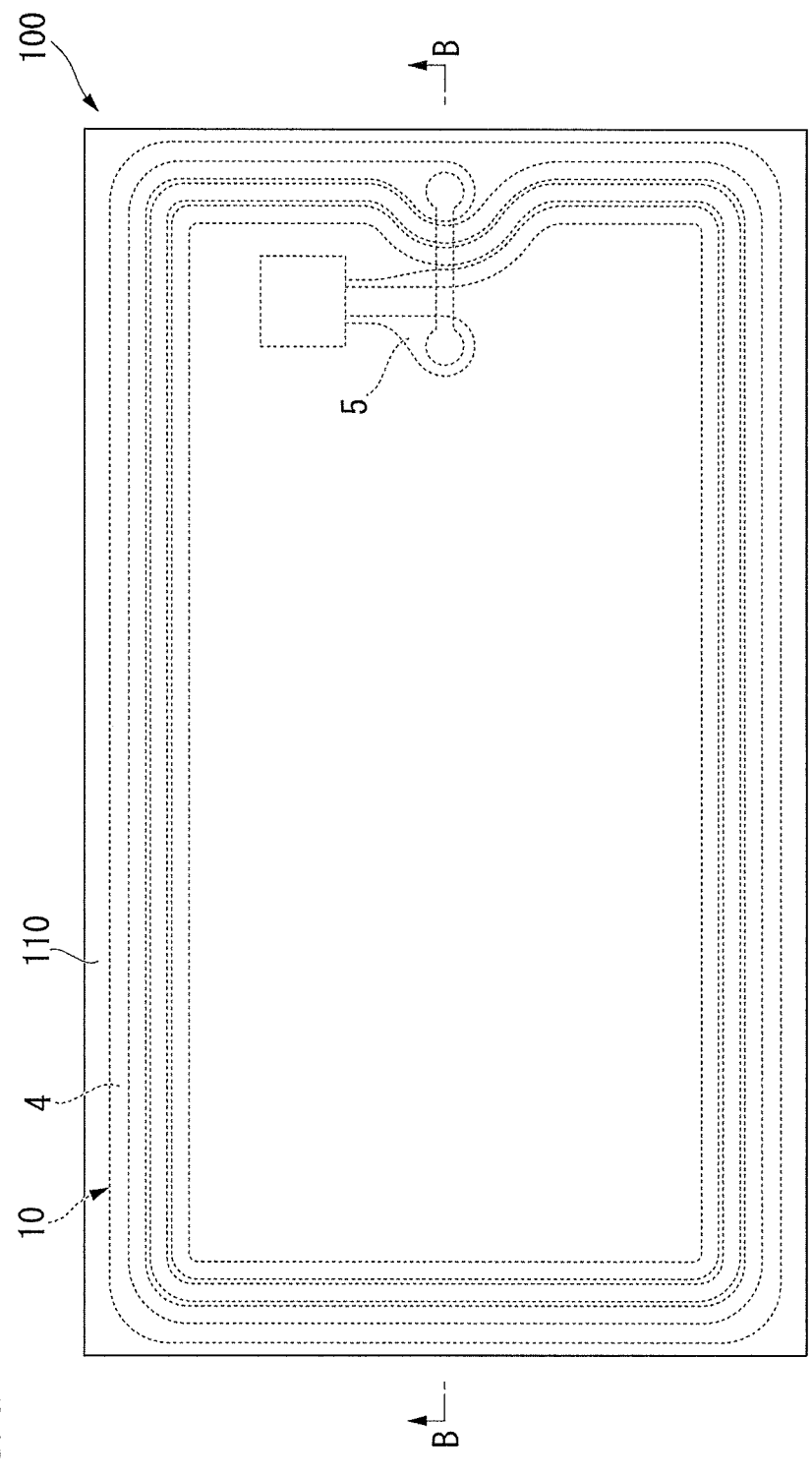
FIG. 6A is a plan view showing a data recording medium according to the embodiment of the present invention.
Figure 6B:
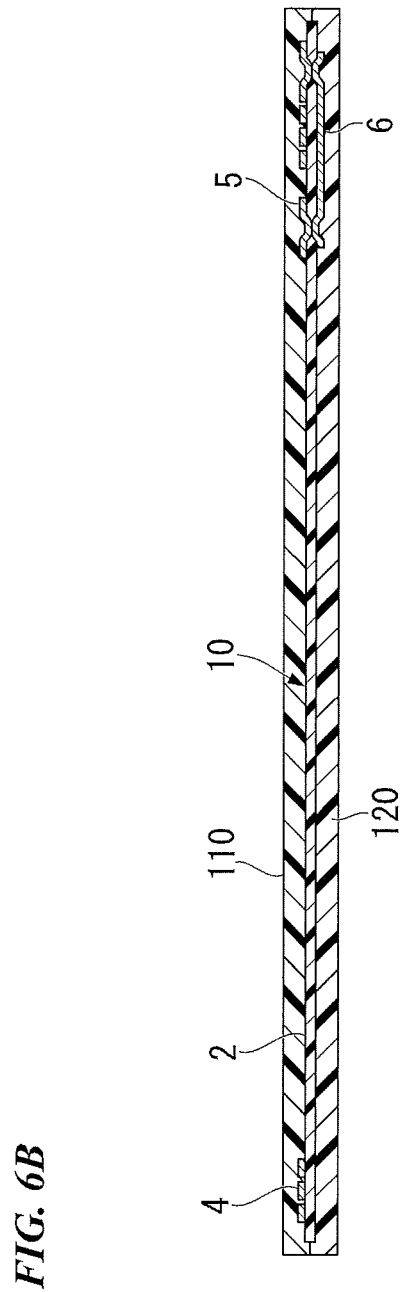
FIG. 6B is a cut-away cross-sectional view along the line B-B of FIG. 6A.

FIG. 6A and FIG. 6B describe a data recording medium 100 that has the above-described IC inlet 10. FIG. 6A is a plan view of the data recording medium 100, and FIG. 6B is a cut-away cross-sectional view along the line B-B in FIG. 6A.

As shown in FIG. 6B, in the data recording medium 100, the IC inlet 10 is sandwiched between protective members 110 and 120, and is bond in the laminated condition with the protective members 110 and 120.

The material used for the protective members 110 and 120 may be, for example, an insulating plastic film or an insulating synthetic paper (polyolefin synthetic paper, made by PPG under the product name of Teslin (registered trademark), or a polypropylene-based synthetic paper made by Yupo Corporation under the product name YUPO (registered trademark)). The plastic film used for the material for forming may be a polyester resin such as PET-G (amorphous PET copolymer), or a thermoplastic resin such as PVC (polyvinyl chloride).

In the case in which the protective members 110 and 120 are made of the above-described plastic film, it is preferable to use a flexible plastic film. Also, the plastic film for forming is preferably one that has a softening temperature that is lower than that of the material for forming the base material of the IC inlet 10.

The thickness of the protective members 110 and 120 can be, for example, approximately 100 µm to approximately 1000 µm. It is preferable that the thickness of the protective members 110 and 120 be from approximately 100 µm to approximately 500 µm. By doing this, not only is it possible to achieve sufficient functionality as a base material, such as strength, but it is also possible to impart sufficient flexibility to the protective members 110 and 120, making application possible in booklet-type applications.

(Method for Manufacturing a Data Recording Medium)

Next, a method of manufacturing a data recording medium (inlay) 100 according to the present embodiment will be described.

First, the IC inlet 10 is sandwiched between a pair of protective members 110 and 120, and the IC inlet 10 and the protective members 110 and 120 are bonded together. When this is done, an aperture somewhat larger than the outer shape of the integrated circuit may be formed in the protective members 110 which is in contact with the integrated circuit mounting surface of the IC inlet 10 at a position corresponding to the position of the integrated circuit 20 that is provided with the IC inlet 10 beforehand.

In the case of using an above-described synthetic paper as the protective members 110 and 120, the method of bonding the IC inlet 10 with the protective members 110 and 120 is one of applying an adhesive to the antenna sheet 1 of the IC inlet 10 or to the surfaces of the protective members 110 and 120 that make contact with the antenna sheet 1. Then, for example, an adhered laminate is made at a relatively low temperature of, for example, approximately 70° C. to approximately 140° C.

It is possible to use as the adhesive an EVA (ethylene vinyl acetate resin) type, an EAA (ethylene acrylate polymer resin), a polyester type, or a polyurethane type or the like. In place of the adhesive, an adhesive sheet using an adhesive as noted above can be sandwiched between the antenna sheet 1 and the protective members 110 and 120.

In the case in which the above-noted thermoplastic film is used as the protective members 110 and 120, the method of bonding the IC inlet 10 and the protective members 110 and 120 is that of heating both to a temperature that exceeds the softening temperature of the protective members 110 and 120 (for example, approximately 130° to approximately 170°) while applying pressure to both. In the case of the thermal lamination method, the above-noted adhesive may be additionally used to assure a reliable melted bond.

In the case of using plastic films as the protective members 110 and 120 as described above, the softening temperature of the formation material is lower than the formation temperature of the formation material of the substrate 2. For this reason, if the protective members 110 and 120 and the IC inlet 10 are heated to approximately 130° to approximately 170°, although the protective members 110 and 120 soften, the substrate 2 of the antenna sheet 1 does not soften. The result is that, in the case in which an IC inlet 10 having an antenna sheet 1 is laminated and bonded by the thermal lamination method, even if heat is applied to the substrate 2 of the antenna sheet 1, the substrate 2 does not plastically flow. It is therefore possible to prevent movement of the antenna coil 4 due to flowing of the substrate 2, and possible to improve the reliability of data communication.

In the case in which the above-described lamination method is used for attachment, and heating is done to above the softening temperature of the substrate 2, so that the substrate 2 becomes plastic and flows, the antenna coil 4, as described above, is band-shaped (film-shaped). For this reason, compared to a conventional winding type antenna coil, the contact surface between the antenna coil 4 and the substrate 2 is increased, enabling the resistance of the antenna coil 4 to flowing to be increased. It is therefore possible to prevent movement of the antenna coil 4 accompanying the flowing of the substrate 2, thereby improving the reliability of data communication.

If necessary in attachment by the lamination method, pressing is performed from one or both of the protective members 110 and 120, to securely bond the IC inlet 10 and to the protective films 110, and 120.

After the bonding of the IC inlet 10 with the protective members 110 and 120, processing is done to achieve the desired shape for the IC inlet 10 that is integrated with the protective members 110 and 120.

The foregoing manufactures the data recording medium 100 shown in FIG. 6A and FIG. 6B.

(Data Carrier with Non-Contact IC)

Figure 7:
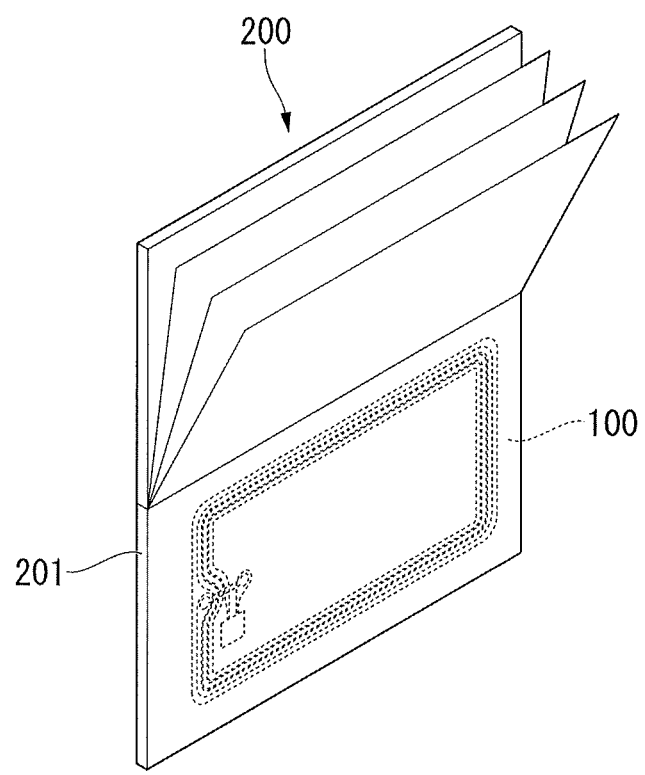
FIG. 7 is a drawing describing a data carrier with a non-contact IC according to the embodiment of the present invention.

FIG. 7 is a drawing describing a booklet article that is one example of a data carrier with a non-contact IC having the above-described data recording medium. In this case, an electronic passport will be taken as the example of the booklet in the description.

As shown in FIG. 7 the electronic passport 200 has the above-described data recording medium 100 as a cover. A cover material 201 that serves as the cover of the electronic passport 200 is bonding to the surface on one side of the data recording medium 100.

By bonding the cover material 201 to the data recording medium 100 in this manner, the look and feel of the electronic passport 200 having the data recording medium 100 can be made the same as a conventional passport. Also, the data recording medium 100 enables an electronic passport 200 that prevents open wires in the antenna coil, and also features superior manufacturability.

The present invention is not restricted to the above-described embodiments. For example, the shape of the antenna coil 4 need not be rectangular. Also, the number of turns in the antenna coil 4 is not restricted to the embodiments.

Additionally, although in the above-described embodiments an integrated circuit is shown as being disposed on the inside of the antenna coil, this is not a restriction, and disposition outside the antenna coil is also possible.

Also, although in the above-described embodiments pressing is done by sandwiching from both surfaces by two heat press heads (FIG. 3A and FIG. 3B), one heat press head 30 only may be used to perform heat pressing from only one direction.

Also, although in the above-described embodiments the description is for the example of an electronic passport as a data carrier with a non-contact IC having the data recording medium 100, this is not a restriction, and use is also possible in, for example, electronic identification documents, and various documents that electronically record and verify a history of activities.

Additionally, the data recording medium 100 according to the embodiment of the present invention can also, for example, be applied to card-type data carriers with a non-contact IC, such as a commuter pass with an IC or an electronic money card or the like. By doing this, by the antenna sheet that has the IC inlet 10, it is possible to prevent open wires in a commuter pass with an IC or in an electronic money card, thereby improving reliability and also improving manufacturability.

While the foregoing is a description of preferred embodiments of the present invention, described with reference to drawings, it is obvious that the present invention is not restricted to the embodiments. The shapes and combinations of the various constituent elements indicated in the above-described embodiments are one example, and various modifications are possible, based on design requirements or the like, without going beyond the scope of the spirit of the present invention.

EXAMPLES

An example of the present invention is described below. In this example, in order to verify the effect of the invention, the value of the resistance between the antenna coil 4 and the bridge pattern 6 in an antenna sheet 1 in which the connection part was laser-welded, as shown in the above-described FIG. 4B, was measured. As a comparison example, the value of the resistance between the antenna coil 4 and the bridge pattern 6 in an antenna sheet 1 in which the connection part was only in contact, as shown in the above-described FIG. 3B, was measured. In the example of the invention, the resistance values of a plurality of test samples were measured and the average thereof taken.

The results of the measurements were that, in the antenna sheet 1 of the example of the present invention in which the antenna coil 4 and the bridge pattern 6 were laser-welded, the average resistance value was 15.6 mΩ, In contrast, in the antenna sheet 1 in which the antenna coil 4 and the bridge pattern 6 were not laser-welded but were just in contact with one another, that is, in the antenna sheet 1 in which the antenna coil 4 and the bridge pattern 6 were brought into contact by crimping, the average resistance value was 18.6 mΩ.

From these results, it was verified that with the antenna sheet 1 having the constitution of the embodiment of the present invention the electrical resistance value was decreased, and that the constitution of the embodiment of the present invention had the effect of solving the problem to be solved.

INDUSTRIAL APPLICABILITY

The present invention can be applied to an antenna sheet that prevents open wires in an antenna, improving the reliability and lowering the electrical resistance, while also improving the manufacturability.

REFERENCE SYMBOLS

1, 1A, 1B Antenna sheet
2 Substrate
4 Antenna coil
4a, 4b Antenna coil ends
6 Bridge pattern, conductive member
8 Through hole
10 IC inlet
20 Integrated circuit (IC chip)
30 Heat press head (pressing unit)
110, 120 Protective member
100 Data recording medium
200 Electronic passport (data carrier with non-contact IC)
H Hole
L Laser beam

What is claimed is:

1. A method for manufacturing an antenna sheet, wherein the method is for connecting at least one of an antenna coil and a connection pattern, to a conductive member, wherein the at least one of the antenna coil and the connection pattern is provided on one surface of a substrate and wherein the conductive member is provided on the other surface of the substrate, the method comprising:
   a pressing in which an overlapped portion is pressed, the overlapped portion being a portion where the at least one of the antenna coil and the connection pattern, and the conductive member overlap each other, the at least one of the antenna coil and the connection pattern being formed from a first metal material, the substrate being formed from a thermoplastic resin, the conductive member being formed from a second metal material, the pressing being performed using a pressing unit from at least one of the one surface and the other surface of the substrate, the pressing being performed to:
      form a first through hole to the substrate, wherein the first through hole passes through the substrate; and
      bring the at least one of the antenna coil and the connection pattern, and the conductive member into contact with each other; and
   a melting in which a melted part is formed at the overlapped portion where the at least one of the antenna coil and the connection pattern, and the conductive member are in contact with each other, the conductive member and one end of the at least one of the antenna coil and the connection pattern are melted in the melted part, the melting being performed to:
      melt the at least one of the antenna coil and the connection pattern, and the conductive member to each other,
   wherein the melting is performed using a laser.

2. The method for manufacturing the antenna sheet according to claim 1, wherein, in the pressing, the overlapped portion is pressed by the pressing unit that is heated to at least the softening temperature of the thermoplastic resin.

3. The method for manufacturing the antenna sheet according to claim 1, further comprising a mounting in which the antenna coil and an integrated circuit are connected to each other.

4. The method for manufacturing the antenna sheet according to claim 1, wherein, in the melting, a focal point of the laser strikes a surface of the at least one of the antenna coil and the connection pattern, or strikes a contact part between the at least one of the antenna coil and the connection pattern, and the conductive member.

5. The method for manufacturing the antenna sheet according to claim 1, wherein an integrated circuit is mounted on the antenna sheet after the melting is performed.

6. The method for manufacturing the antenna sheet according to claim 1, wherein the melting is performed after the pressing is performed.

7. The method for manufacturing the antenna sheet according to claim 1, wherein the pressing unit has flat end.

8. The method for manufacturing the antenna sheet according to claim 1, wherein a size of a head diameter of the pressing unit is 1.0 to 10 times as large as a diameter of the laser.

9. The method for manufacturing the antenna sheet according to claim 1, wherein the pressing is performed with blowing air onto the overlapped portion.

10. The method for manufacturing the antenna sheet according to claim 1,
wherein a first thickness of the substrate is thinner than a second thickness of the substrate, the first thickness being at a first part where the substrate contacts with the melted part, the second thickness being at a second part where the substrate does not contact with the melted part.

11. The method for manufacturing the antenna sheet according to claim 1, wherein a second through hole is formed when the conductive member and the at least one of the antenna coil and the connection pattern are melted.

12. The method for manufacturing the antenna sheet according to claim 1, wherein a thickness of the melted part is fixed.

13. The method for manufacturing the antenna sheet according to claim 1, wherein
the melted part is formed at first region, the first region being from first surface to second surface, the first surface being one surface of the at least one of the antenna coil and the connection pattern, and the second surface being another surface of the first surface,
the melted part is formed at second region, the second region being from third surface to a plane, the third surface being one surface of the conductive member, the plane being at between the third surface and fourth surface, the fourth surface being another surface of the third surface, and
the second surface contacts to the third surface.

14. The method for manufacturing the antenna sheet according to claim 1, wherein
the melted part is configured to cover an inner wall of a second through hole, and
the second through hole is configured to pass through the substrate, the conductive member and the at least one of the antenna coil and the connection pattern.

* * * * *